United States Patent
Park et al.

(10) Patent No.: US 12,334,330 B2
(45) Date of Patent: Jun. 17, 2025

(54) SUBSTRATE TREATING APPARATUS

(71) Applicant: SEMES CO., LTD., Cheonan-si (KR)

(72) Inventors: Miso Park, Daejeon (KR); Yong Hee Lee, Cheonan-si (KR); Eui Sang Lim, Cheonan-si (KR); Jinwoo Jung, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 110 days.

(21) Appl. No.: 17/370,475

(22) Filed: Jul. 8, 2021

(65) Prior Publication Data
US 2022/0020609 A1    Jan. 20, 2022

(30) Foreign Application Priority Data
Jul. 15, 2020 (KR) .................... 10-2020-0087314

(51) Int. Cl.
| | | |
|---|---|---|
| H01L 21/02 | (2006.01) | |
| B08B 7/00 | (2006.01) | |
| B08B 13/00 | (2006.01) | |
| H01L 21/67 | (2006.01) | |

(52) U.S. Cl.
CPC ...... *H01L 21/02101* (2013.01); *B08B 7/0021* (2013.01); *B08B 13/00* (2013.01); *H01L 21/67028* (2013.01); *H01L 21/67034* (2013.01)

(58) Field of Classification Search
CPC ......... H01L 21/02101; H01L 21/67034; B08B 7/0021; B08B 13/00
See application file for complete search history.

(56) References Cited

U.S. PATENT DOCUMENTS

| | | | | | |
|---|---|---|---|---|---|
| 4,128,111 | A | * | 12/1978 | Hansen | F16K 15/03 |
| | | | | | 137/515.7 |
| 4,194,532 | A | * | 3/1980 | Hall | F15B 11/08 |
| | | | | | 91/454 |
| 6,134,807 | A | * | 10/2000 | Komino | H01L 21/67034 |
| | | | | | 34/418 |

(Continued)

FOREIGN PATENT DOCUMENTS

| CN | 10761056 A | 1/2018 |
|---|---|---|
| CN | 108074844 A | 5/2018 |

(Continued)

OTHER PUBLICATIONS

Office Action dated Apr. 21, 2023, issued in corresponding Korean Patent Application No. 10-2020-0087314.

(Continued)

*Primary Examiner* — Joseph L. Perrin
*Assistant Examiner* — Kevin G Lee
(74) *Attorney, Agent, or Firm* — Harness, Dickey & Pierce, P.L.C.

(57) ABSTRACT

An apparatus for treating a substrate using a treating fluid in a supercritical state is provided. In a pressure increasing step of increasing a pressure in the treating space from a pressure lower than a critical pressure of the treating fluid to a treating pressure higher than the critical pressure, the apparatus controls a supply amount of the treating fluid supplied from a first supply port to control flow of the treating fluid supplied from the first supply port and then exhausted through an exhaust port.

19 Claims, 7 Drawing Sheets

(56) References Cited

U.S. PATENT DOCUMENTS

| | | | |
|---|---|---|---|
| 2004/0112540 A1* | 6/2004 | Larson | H01J 37/3244 |
| | | | 257/E21.252 |
| 2015/0155188 A1 | 6/2015 | Jung et al. | |
| 2015/0329970 A1* | 11/2015 | Khan | H01L 21/6719 |
| | | | 118/719 |
| 2015/0377571 A1* | 12/2015 | Hiroki | H01J 37/32724 |
| | | | 165/296 |
| 2018/0012755 A1* | 1/2018 | Lee | F26B 21/10 |
| 2018/0096863 A1 | 4/2018 | Goshi et al. | |
| 2018/0138035 A1 | 5/2018 | Ohno et al. | |
| 2020/0357649 A1* | 11/2020 | Kawabuchi | F26B 3/24 |
| 2020/0388512 A1* | 12/2020 | Biwa | H01L 21/67017 |

FOREIGN PATENT DOCUMENTS

| | | |
|---|---|---|
| KR | 2013-0134993 A | 12/2013 |
| KR | 2018-0006716 A | 1/2018 |
| KR | 2018-0055731 A | 5/2018 |
| KR | 10-2018-0136863 A | 12/2018 |
| KR | 10-2019-0041158 A | 4/2019 |
| KR | 102075683 B1 | 3/2020 |

OTHER PUBLICATIONS

Chinese Office Action dated Apr. 3, 2025 issued in Chinese Patent Application No. 202110803475.4.

* cited by examiner

SUBSTRATE TREATING APPARATUS

CROSS-REFERENCE TO RELATED APPLICATIONS

A claim for priority under 35 U.S.C. § 119 is made to Korean Patent Application No. 10-2020-0087314 filed on Jul. 15, 2020, in the Korean Intellectual Property Office, the entire contents of which are hereby incorporated by reference.

BACKGROUND

Embodiments of the inventive concept described herein relate to a substrate treating apparatus.

As a design rule of an integrated circuit element is reduced, a critical dimension of a semiconductor element is reduced to about 20 nm to 30 nm or smaller. Accordingly, a process for forming a deep and narrow pattern having a relatively large aspect ratio of about 5 or greater, and accompanying cleaning and drying processes are required. In performing a predetermined treating process including etching, cleaning, drying, etc., on a substrate in which a structure having a larger aspect ratio is formed, methods using supercritical fluid have been proposed.

When treating fluid is injected into a treating space inside a chamber that performs supercritical treating, flow of the treating fluid is non-uniform on the substrate accommodated in the chamber, and a vortex occurs on a partial region thereof until a pressure inside the treating space reaches a treating pressure equal to or higher than a critical pressure of the treating fluid.

SUMMARY

Embodiments of the inventive concept provide a substrate treating apparatus capable of efficiently treating a substrate.

Embodiments of the inventive concept provide a substrate treating apparatus capable of controlling flow of a treating fluid before the treating fluid is brought into a supercritical state.

Embodiments of the inventive concept provide a substrate treating apparatus capable of controlling flow of the treating fluid before the treating fluid is brought into the supercritical state, thereby lowering an initial concentration of chemical liquid, and lowering a concentration of moisture remaining inside the chamber performing supercritical treating.

Embodiments of the inventive concept provide a substrate treating apparatus capable of controlling a concentration of the chemical liquid and a concentration of residual moisture inside the chamber, thereby increasing a replacement force in a fine pattern and preventing drying failure.

Purposes according to the inventive concept are not limited to the above-mentioned purpose. Other purposes and advantages according to the inventive concept that are not mentioned may be understood based on following descriptions, and may be more clearly understood based on embodiments according to the inventive concept. Further, it will be easily understood that the purposes and advantages according to the inventive concept may be realized using means shown in the claims and combinations thereof.

In one aspect, an apparatus for treating a substrate using a treating fluid in a supercritical state is provided. The apparatus includes a chamber for providing a treating space for treating the substrate, a substrate support disposed within the chamber for supporting the substrate when the substrate may be loaded into the chamber, a first supply port disposed in a lower wall of the chamber, wherein the first supply port may be connected to a first supply line for supplying treating fluid to a portion of the treating space located below the substrate, an exhaust port disposed in the lower wall of the chamber and spaced apart from the first supply port by a predetermined spacing, wherein the exhaust port may be connected to an exhaust line for exhausting the treating fluid from the chamber, a branch line branching from the exhaust line and at a position of the exhaust line upstream of an exhaust valve installed at the exhaust line, wherein the branch line may be always open, and a controller that controls supply and exhaust of the treating fluid, wherein in a pressure increasing step of increasing a pressure in the treating space from a pressure lower than a critical pressure of the treating fluid to a treating pressure higher than the critical pressure, the controller controls a supply amount of the treating fluid supplied from the first supply port to control flow of the treating fluid supplied from the first supply port and then exhausted through the exhaust port.

In one embodiment, the apparatus may further include an orifice installed in the branch line.

In one embodiment, a diameter of the orifice may be smaller than a diameter of the exhaust line.

In one embodiment, the branch line may be a bypass line installed in a parallel manner to the exhaust valve.

In one embodiment, the controller may control the supply amount of the treating fluid so as to maintain the pressure in the treating space for a portion of an entire period of the pressure increasing step.

In one embodiment, the controller may control a supply flow rate of the treating fluid to a first flow rate for a predefined portion of a period before the pressure in the treating space reaches the critical pressure of the treating fluid in the pressure increasing step, thereby controlling the flow of the treating fluid in the treating space, and control the supply flow rate of the treating fluid to a second flow rate greater than the first flow rate to increase the pressure in the treating space to the treating pressure.

In one embodiment, the apparatus may further include a second supply port connected to a second supply line for supplying the treating fluid to a portion of the treating space located above the substrate, wherein the controller may supply the treating fluid from the first supply port for a period before the pressure in the treating space reaches the critical pressure of the treating fluid in the pressure increasing step, supply the treating fluid in the supercritical state from the second supply port for a period after the pressure in the treating space has reached the critical pressure of the treating fluid, and after the treating of the substrate using the treating fluid in the supercritical state has been completed, open the exhaust valve to exhaust the treating fluid inside the treating space.

In one embodiment, the apparatus may further include a blocking plate disposed between the first supply port and the substrate support for preventing the treating fluid from the first supply port from being sprayed directly onto the substrate, wherein a top face of the blocking plate may be positioned adjacent to a bottom face of the substrate.

In one embodiment, the controller may control a supply flow rate of the treating fluid for a first period of the pressure increasing step and a supply flow rate of the treating fluid for a second period of the pressure increasing step subsequent to the first period to be different from each other.

In one embodiment, the controller may control the supply flow rate of the treating fluid for the first period to a first flow rate, and control the supply flow rate of the treating fluid for the second period to a second flow rate greater than the first flow rate.

In another aspect, an apparatus for treating a substrate using a treating fluid in a supercritical state is provided. The apparatus includes a chamber for providing a treating space for treating the substrate, a substrate support disposed within the chamber for supporting the substrate when the substrate may be loaded into the chamber, a first supply port disposed in a lower wall of the chamber, wherein the first supply port may be connected to a first supply line for supplying treating fluid to a portion of the treating space located below the substrate, a first exhaust port disposed in the lower wall of the chamber and spaced apart from the first supply port by a predetermined spacing, wherein the first exhaust port may be connected to a first exhaust line for exhausting the treating fluid from the chamber, a second exhaust port connected to a second exhaust line for exhausting the treating fluid from the chamber, wherein the second exhaust port may be always open, and a controller that controls supply and exhaust of the treating fluid, wherein in a pressure increasing step of increasing a pressure in the treating space from a pressure lower than a critical pressure of the treating fluid to a treating pressure higher than the critical pressure, the controller may control a supply amount of the treating fluid supplied from the first supply port to control flow of the treating fluid supplied from the first supply port and then exhausted through the second exhaust port.

In one embodiment, the apparatus may further include an orifice installed in the second exhaust port.

In one embodiment, a diameter of the orifice may be smaller than a diameter of the first exhaust line.

In one embodiment, the controller may control the supply amount of the treating fluid so as to maintain the pressure in the treating space for a portion of an entire period of the pressure increasing step.

In one embodiment, the controller may control a supply flow rate of the treating fluid to a first flow rate for a predefined portion of a period before the pressure in the treating space reaches the critical pressure of the treating fluid in the pressure increasing step, thereby controlling the flow of the treating fluid in the treating space, and control the supply flow rate of the treating fluid to a second flow rate greater than the first flow rate to increase the pressure in the treating space to the treating pressure.

In one embodiment, the apparatus may further include a second supply port connected to a second supply line for supplying the treating fluid to a portion of the treating space located above the substrate, wherein the controller may supply the treating fluid from the first supply port for a period before the pressure in the treating space reaches the critical pressure of the treating fluid in the pressure increasing step, supply the treating fluid in the supercritical state from the second supply port for a period after the pressure in the treating space has reached the critical pressure of the treating fluid, and after the treating of the substrate using the treating fluid in the supercritical state has been completed, open the first exhaust valve to exhaust the treating fluid inside the treating space.

In one embodiment, the first exhaust port may be disposed at a center of the lower wall of the chamber, wherein the first supply port may be disposed at a position spaced, in one direction, from the first exhaust port, wherein the second exhaust port may be disposed at a position spaced, in an opposite direction to one direction, from the first exhaust port, and may be opposite to the first supply port around the first exhaust port.

In one embodiment, the controller may control a supply flow rate of the treating fluid for a first period of the pressure increasing step and a supply flow rate of the treating fluid for a second period of the pressure increasing step subsequent to the first period to be different from each other.

In one embodiment, the controller may control the supply flow rate of the treating fluid for the first period to the first flow rate, and control the supply flow rate of the treating fluid for the second period to a second flow rate greater than the first flow rate.

In still another aspect, an apparatus for treating a substrate using a treating fluid in a supercritical state is provided. The apparatus includes a chamber for providing a treating space for treating the substrate, a substrate support disposed within the chamber for supporting the substrate when the substrate may be loaded into the chamber, a first supply port connected to a first supply line for supplying treating fluid to a portion of the treating space located below the substrate, a second supply port connected to a second supply line for supplying the treating fluid to a portion of the treating space located above the substrate, an exhaust port connected to an exhaust line for exhausting the treating fluid from the chamber, a branch line branching from the exhaust line and at a position of the exhaust line upstream of an exhaust valve installed at the exhaust line, wherein the branch line may be always open, wherein an orifice may be installed in the branch line, wherein a diameter of the orifice may be smaller than a diameter of the exhaust line, a blocking plate disposed between the first supply port and the substrate support for preventing the treating fluid from the first supply port from being sprayed directly onto the substrate, and a controller configured to control supply and exhaust of the treating fluid, wherein in a pressure increasing step of increasing a pressure in the treating space from a pressure lower than a critical pressure of the treating fluid to a treating pressure higher than the critical pressure, the controller may control a supply amount of the treating fluid supplied from the first supply port to control flow of the treating fluid supplied from the first supply port and then exhausted through the exhaust port, wherein the controller may control a supply flow rate of the treating fluid for a first period of the pressure increasing step and a supply flow rate of the treating fluid for a second period of the pressure increasing step subsequent to the first period to be different from each other, wherein the controller may control the supply flow rate of the treating fluid for the first period to a first flow rate, and control the supply flow rate of the treating fluid for the second period to a second flow rate greater than the first flow rate, wherein the first period may be a period before the pressure in the inside of the treating space reaches the critical pressure of the treating fluid, wherein the controller may supply the treating fluid from the first supply port for a period before the pressure in the treating space reaches the critical pressure of the treating fluid in the pressure increasing step, supply the treating fluid in the supercritical state from the second supply port for a period after the pressure in the treating space has reached the critical pressure of the treating fluid, and after the treating of the substrate using the treating fluid in the supercritical state has been completed, open the exhaust valve to exhaust the treating fluid inside the treating space.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
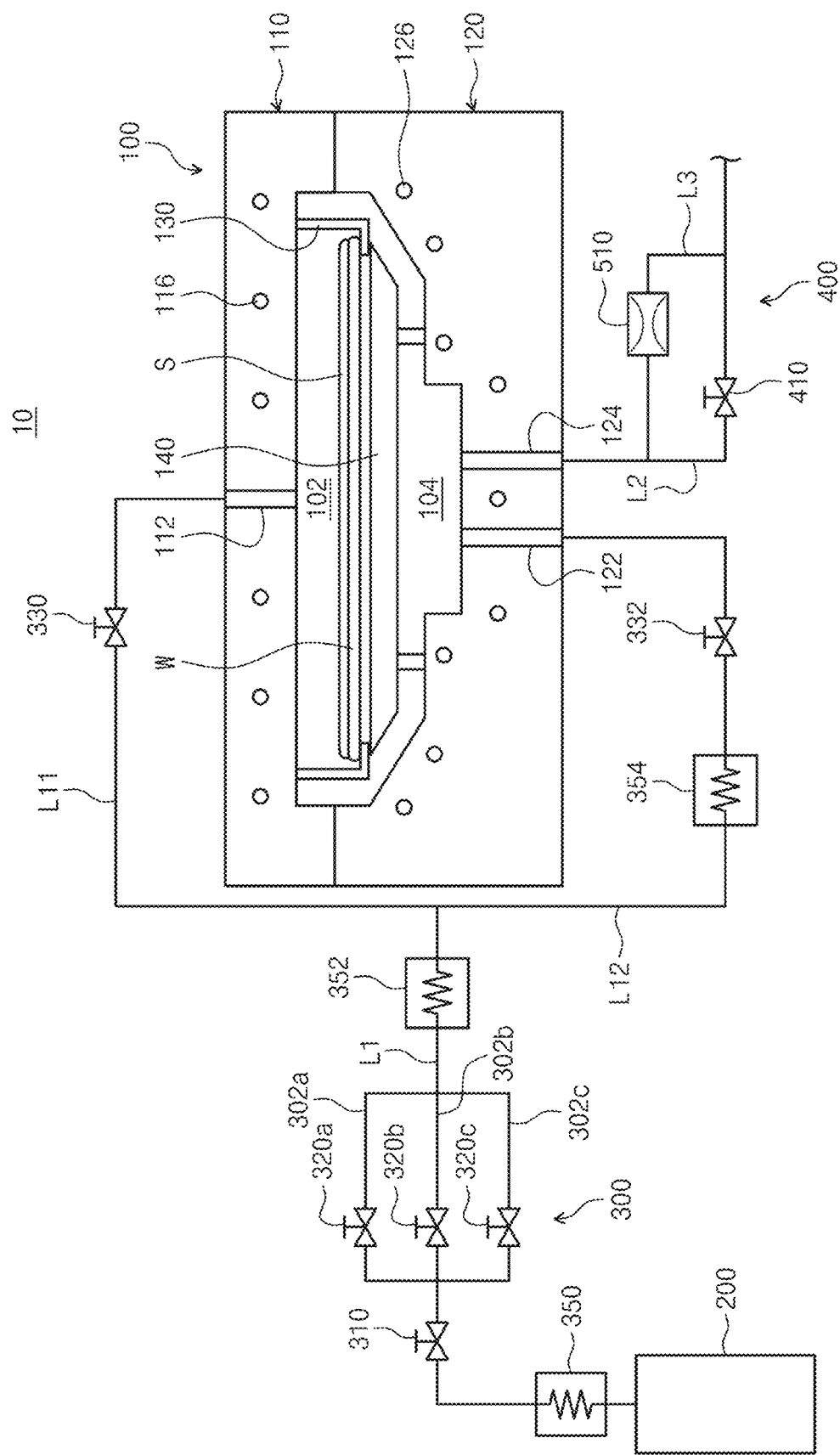
FIG. 1 is a diagram schematically showing a substrate treating apparatus according to an embodiment of the inventive concept.

Hereinafter, an embodiment of the inventive concept will be described in more detail with reference to the accompanying drawings. Embodiments of the inventive concept may be modified in various forms. Thus, a scope of the inventive concept should not be construed as being limited to the following embodiments. Those embodiments are provided to describe the inventive concept more fully for a person with average knowledge in the art. Therefore, a shape of an element in the drawing is exaggerated to emphasize clearer descriptions thereof.

FIG. 1 is a diagram schematically illustrating a substrate treating apparatus 10 according to an embodiment of the inventive concept.

Referring to FIG. 1, the substrate treating apparatus 10 may include a substrate treating unit 100 for supporting a substrate such as a wafer W, and for treating the substrate via a supercritical process using supercritical fluid, a supercritical fluid generator 200 for generating the supercritical fluid, a fluid supply 300 for supplying the supercritical fluid from the supercritical fluid generator 200 to a process chamber 100, and a fluid exhaust 400 for exhausting the supercritical fluid from the process chamber 100.

The supercritical process may include a cleaning process, a drying process, and an etching process using the supercritical fluid. The supercritical fluid may be a substance having a temperature and a pressure above a critical point thereof and having gas-like diffusivity, viscosity, and surface tension, and liquid-like solubility. For example, the supercritical fluid may include carbon dioxide ($CO_2$), water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$), etc.

In one embodiment, the substrate treating unit 100 may include a chamber 110 and 120, a first substrate support 130, a first supply port 122, a second supply port 112, and an exhaust port 124. The substrate treating unit 100 may dry the substrate W subjected to a rinse process using the treating fluid in a supercritical state. In one embodiment, the treating fluid may be carbon dioxide ($CO_2$).

The chamber 110 and 120 may provide a treating space 102 and 104 for drying the substrate. The treating space 102 and 104 may include the process region 102 and the buffer region 104. The process region 102 may be a region containing chemical liquid S on the substrate W, and the buffer region 104 may be a region below the substrate W.

The chamber 110 and 120 may include the upper chamber 110 and the lower chamber 120. The upper chamber 110 may include an upper wall and a first side wall. The upper wall of the upper chamber 110 may be embodied as an upper wall of the chamber. The first side wall of the upper chamber 110 may be embodied as a portion of a side wall of the chamber. The lower chamber 120 may include a lower wall and a second side wall. The lower wall of the lower chamber 120 may be embodied as a lower wall of the chamber. The second side wall of the lower chamber 120 may be embodied as a portion of the side wall of the chamber.

The upper chamber 110 and the lower chamber 120 may move relative to each other under an operation of a driving mechanism (not shown) such that both may be engaged with or be separated from each other so that both may switch into between a closed state of the chamber 110 and 120 and an open state of the chamber 110 and 120. For example, at least one of the upper chamber 110 and the lower chamber 120 may move up and down along an elevating rod (not shown) such that both may be coupled to or separated from each other. In the open state of the chamber 110 and 120, the substrate W may be loaded/unloaded into/from the chamber. In the closed state of the chamber, a supercritical drying process of the substrate W may be performed.

The substrate support 130 may be disposed within the chamber 110 and 120 and may support the substrate W when the substrate W is loaded into the chamber 110 and 120. The substrate support 130 may support the substrate W when the substrate W is loaded/unloaded into/from the chamber 110 and 120 in the open state of the chamber 110 and 120. Further, the substrate support 130 may support the substrate W when the substrate W is treated within the chamber 110 and 120.

The substrate support 130 may include a first vertical rod extending downward from the upper wall of the upper chamber 110 and a first horizontal rod extending in a horizontal direction from one end of the first vertical rod. Further, the substrate support 130 may include at least one first support protrusion (not shown) that protrudes from the first horizontal rod and supports the substrate W while being in contact with an edge region of the substrate W. Two substrate supports 130 are spaced apart from each other by a spacing corresponding to a diameter of the substrate W. Thus, each of the substrate supports 130 may support the edge region of the substrate W.

The substrate treating unit 100 may include a blocking plate 140 disposed between the lower wall of the lower chamber 120 and the substrate support 130. The blocking plate 140 may be installed to be spaced apart from the lower wall of the lower chamber 120 by a predefined spacing. The blocking plate 140 may be fixed onto the lower wall of the lower chamber 120 via a support rod. The blocking plate 140 may include a plate having a predefined thickness that occupies a predetermined space within the buffer region 104. The blocking plate 140 may prevent the supercritical fluid from the first supply port 122 from being sprayed directly onto a rear surface of the substrate W.

Further, a volume of the buffer region 104 may be reduced due to the blocking plate 140. The volume of the buffer region 104 may be smaller than a volume of the process region 102. Accordingly, an amount of the treating fluid present in the buffer region 104 below the substrate W may be smaller than an amount of the treating fluid present in the process region 102 above the substrate W. The blocking plate 140 may be present in a buffer space under the substrate W in order to maintain a process performance and, at the same time, to reduce the amount of the treating fluid used in the drying process. Thus, the blocking plate 140 may reduce the buffer space to reduce a process time.

Further, a space may be maintained between the blocking plate 140 and the lower wall of the lower chamber 120, such that a direction of the fluid flow inside a high-pressure chamber may be adjusted.

The treating fluid is stored at a high pressure and in the supercritical fluid generator 200 and then passes through pipes L1, L11, and L12 and valves 310, 320a, 320b, 320c, 330, and 332 of the fluid supply 300 and then is introduced into a drying process chamber. In this travel process, a cooling phenomenon of the treating fluid occurs due to a drop in a pressure thereof at the valves 310, 320a, 320b, 320c, 330, and 332 and pipe connection portions. Thus, the treating fluid is liquefied or solidified and thus remains as particulate contaminations on the substrate. Alternatively, other impurities may cause solidification of the treating fluid. For this reason, it is important for the treating fluid to be maintained at a temperature above a critical point. When a pressurization speed is increased, simply maintaining a temperature of the pipe is insufficient to transfer sufficient heat to solvent in a gas or supercritical state. Thus, additional heat exchanger 350, 352, and 354 (or a temperature adjustment jacket) are used to minimize phase change and reduce density change due to a temperature during transfer of the treating fluid from the supercritical fluid generator 200 to the drying process chamber 100 to facilitate pressurization and pressure-decreasing time control.

The first supply port 122 may be installed at the lower chamber 120. The first supply port 122 may be located in the lower wall of the lower chamber 120. The treating fluid may be supplied to the buffer region 104 located below the substrate W through the first supply port 122.

The second supply port 112 may be installed at the upper chamber 110. The second supply port 112 may be located in a central region of the upper wall of the upper chamber 110. The treating fluid may be supplied to the process region 102 located above the substrate W through the second supply port 112.

The exhaust port 124 may be installed at the lower chamber 120. The exhaust port 124 may be located in a portion of the lower wall of the lower chamber 120 adjacent to the first supply port 122. The exhaust port 124 may exhaust the fluid used in the supercritical fluid process from the treating space of the chamber. The exhausted treating fluid may have a chemical liquid dissolved therein. The treating fluid exhausted from the exhaust port 124 may be drained or supplied to a regeneration apparatus (not shown) in which the treating fluid may be separated into supercritical fluid and an organic solvent.

The substrate treating unit 100 may include a heater disposed in at least one of the upper wall and the side wall of the upper chamber 110, and the lower wall and the side wall of the lower chamber 120. The heater may heat an inside of the chamber so that the treating fluid supplied to the inside of the chamber is maintained at a temperature above a critical temperature. For example, the heater may include a first heater 116 disposed at the upper chamber 110 and a second heater 126 disposed at the lower chamber 120.

Figure 3:
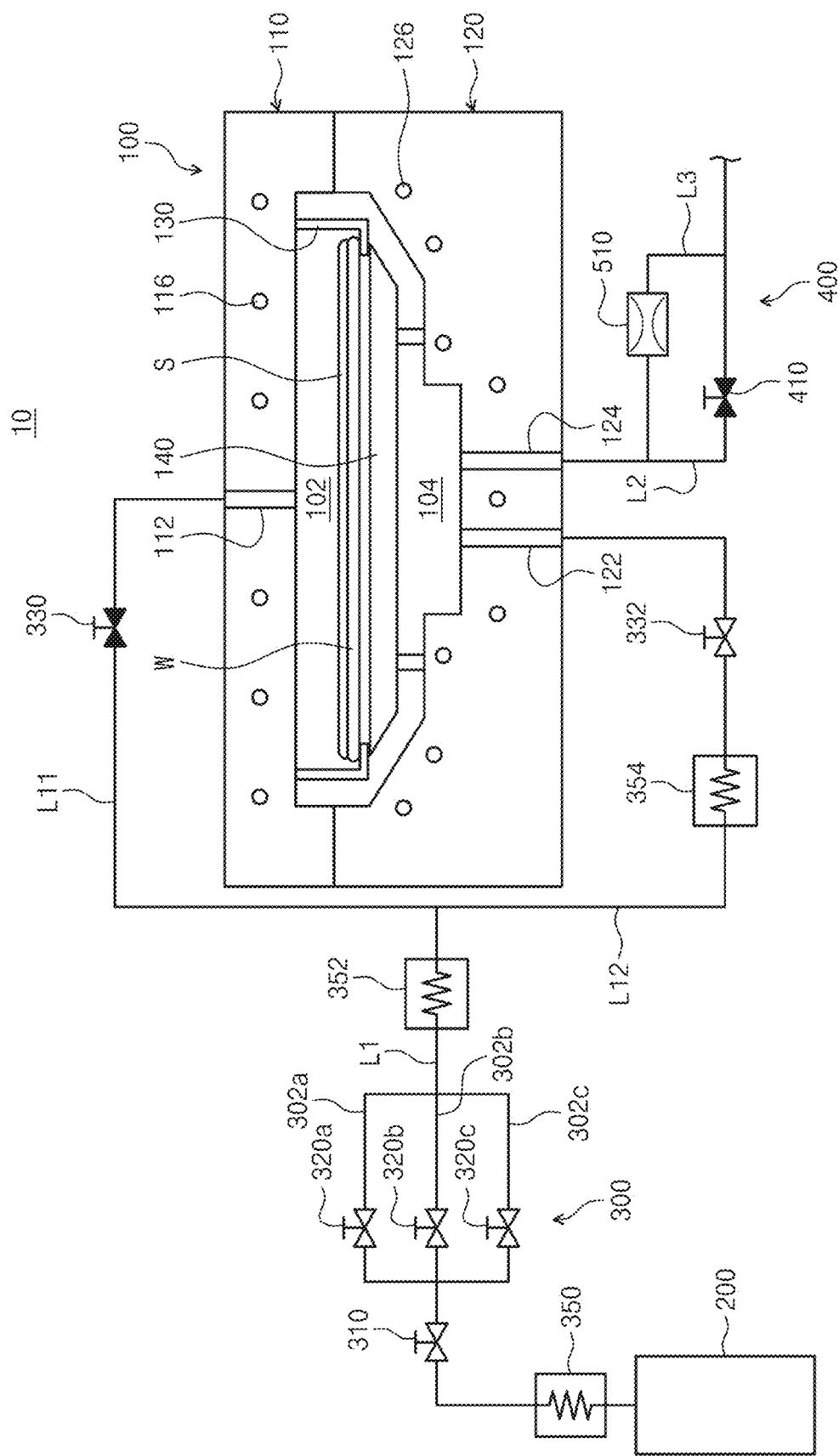
Figure 4:
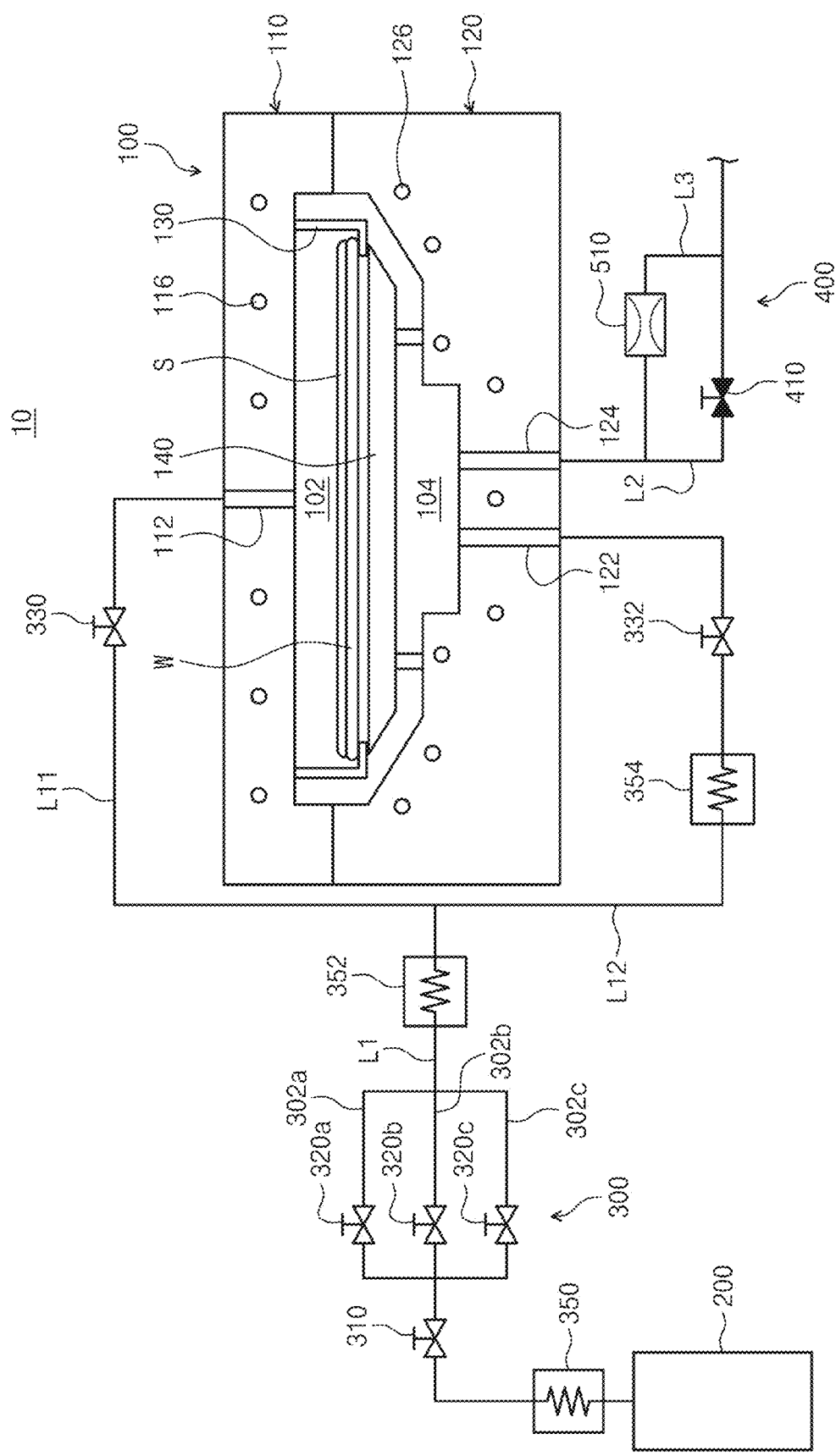
Figure 5:
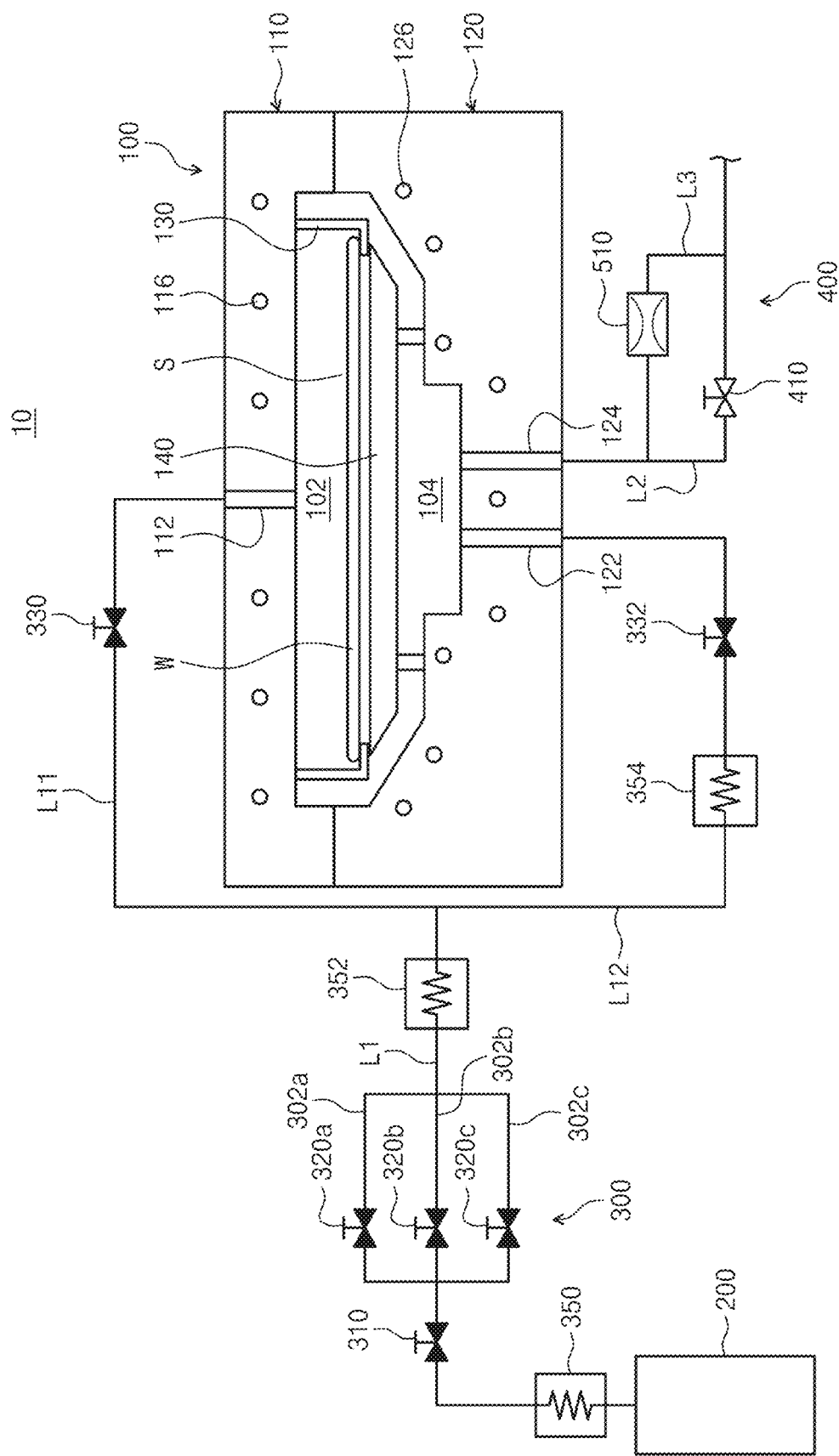
Figure 6:
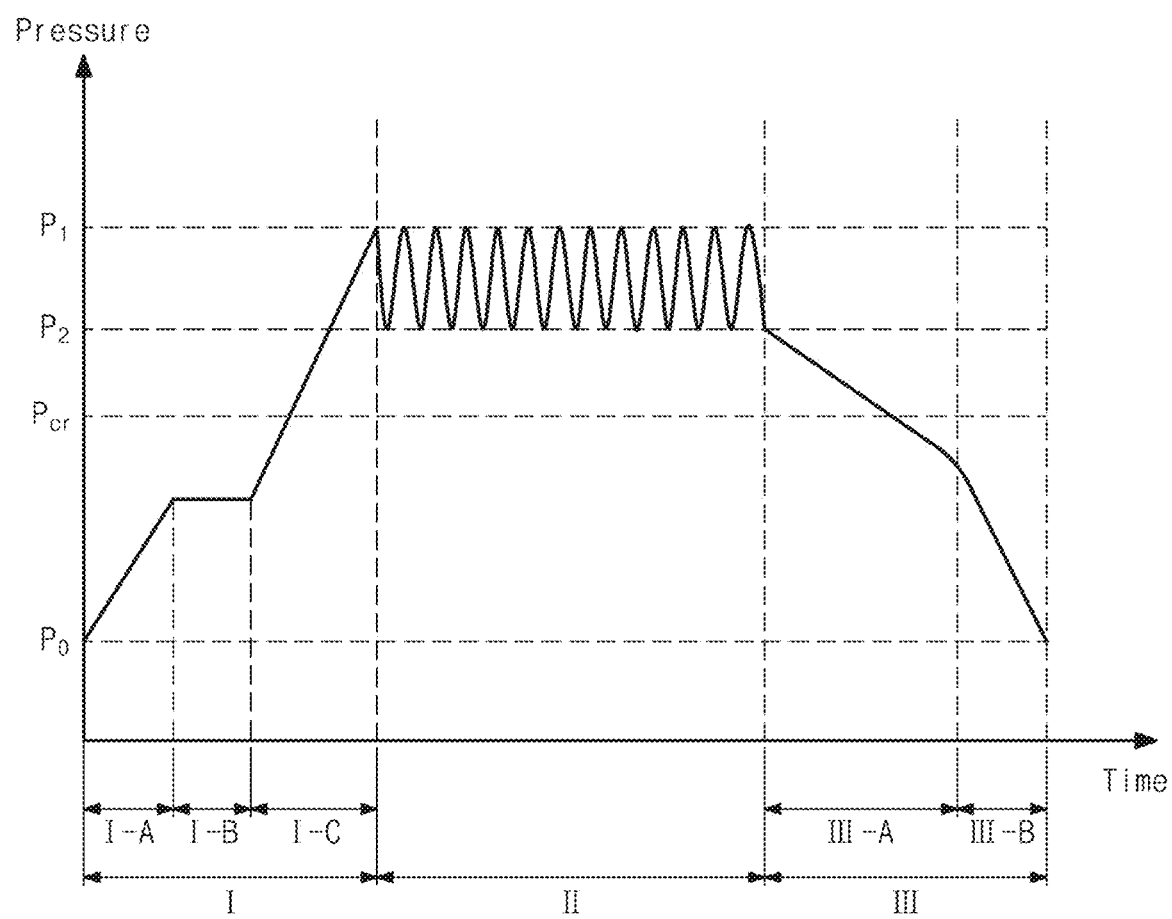
FIG. 6 shows pressure change inside a treating space in a chronological order according to one embodiment of the inventive concept.

FIG. 2 to FIG. 5 sequentially show states in which the substrate treating apparatus has been controlled according to an order in which a process is performed using the substrate treating apparatus according to one embodiment of the inventive concept. FIG. 6 shows change in a pressure inside the treating space in a chronological order according to one embodiment of the inventive concept. Referring to FIG. 5 to FIG. 6, a treating process of the substrate W is described. A process of drying the substrate is described by way of example.

Figure 2:
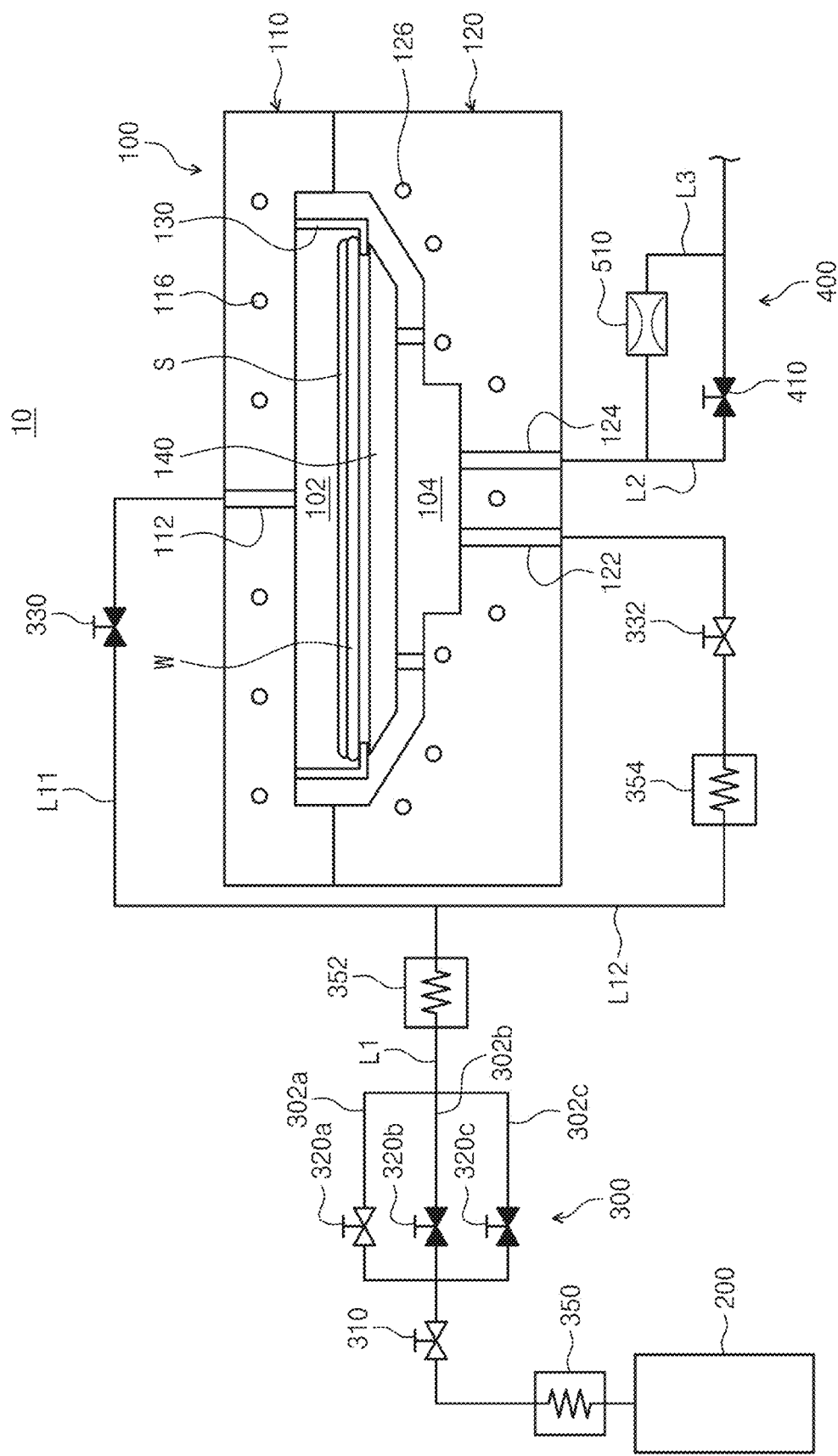
FIG. 2 to FIG. 5 sequentially show states in which the substrate treating apparatus has been controlled according to an order in which a process is performed using the substrate treating apparatus according to one embodiment of the inventive concept.

To dry the substrate W, the substrate W is loaded into the chamber and seated on the substrate support 130 as shown in FIG. 2.

Then, a drying process using the supercritical fluid is performed in the chamber. Specifically, chemical liquid S remaining in a process (e.g., a rinse process) before the drying process is mixed (replaced) with the supercritical fluid. Then, the mixed supercritical fluid may be exhausted. Thus, the chemical liquid S has been removed from the substrate. The chemical liquid S may be an organic solvent and may be an anti-leaning liquid. Further, the chemical liquid S may be isopropyl alcohol (IPA).

The drying process may include a pressure increasing step I for increasing an inside of the treating space to a high pressure to bring the treating fluid into a supercritical state of high temperature and high pressure, a replacement step, that is, a drying step II for removing the mixed liquid solvent, and an exhausting step III for decreasing the pressure of the inside of the treating space back to an atmospheric pressure. The exhausting step III may include a low-speed pressure decreasing step III-A and a high-speed pressure decreasing step III-B. The pressure of the treating space of the substrate treating unit 100 may be controlled to change over according to the pressure increasing step I, the replacement step II, and the exhausting step III.

The fluid supply 300 may supply the treating fluid into the chamber to increase the pressure of the treating space in the chamber. The fluid exhaust 400 may exhaust the treating fluid from the chamber.

In the pressure increasing step I, a controller (not shown) increases the pressure in the treating space from a pressure lower than a critical pressure of the treating fluid to a treating pressure higher than the critical pressure. The controller (not shown) controls a supply amount of the treating fluid supplied from the first supply port 122 to control flow of the treating fluid which is supplied from the first supply port 122 and is exhausted through the exhaust port 124.

The exhaust port 124 is connected to an exhaust line L2. An exhaust valve 410 is installed at the exhaust line L2.

A branch line L3 branches from the exhaust line L2 and at a position thereof upstream of the exhaust valve 410, and is maintained at an always open state. An orifice 510 is installed at the branch line L3. A diameter of the orifice 510 is smaller than a diameter of the exhaust line L2. In the illustrated embodiment, the branch line L3 is embodied as a bypass line installed in parallel with the exhaust valve 410. However, according to another embodiment, an end of the branch line L3 may be drained in a separate manner from the exhaust line L2.

When the treating fluid is supplied at a first flow rate through the first supply port 122 in the pressure increasing step I, the treating fluid flows along the first supply port 122 and then toward a top face of the substrate W and then to the exhaust port 124. In this connection, the exhaust valve 410 is closed, such that the treating fluid passing through the exhaust port 124 is drained through the branch line L3. The first flow rate is set such that the treating fluid creates a laminar flow on the top face of the substrate W. Specifically, in the pressure increasing step I, for a period before the pressure in the treating space reaches a critical pressure Pcr, a supply flow rate of the treating fluid is controlled to the first flow rate, thereby controlling the flow of the treating fluid in the treating space. Supplying of the treating fluid at the first flow rate may be achieved by selecting and controlling one of first adjustment lines 302a, 302b, and 302c in which a plurality of first adjustment valves 320a, 320b, and 320c of the fluid supply 300 are respectively installed, that is, by selecting and controlling one of adjustment lines to allow three steps adjustment. According to another embodiment, a flow rate control device (not shown) may be installed at the supply line L1 to control the flow rate.

In a state in which the flow in the treating space is controlled, a concentration of the chemical liquid forming a liquid film on the substrate is lowered, and a concentration of moisture remaining in the chamber is lowered, the supply flow rate of the treating fluid is increased. In one embodiment, the supply flow rate of the treating fluid is controlled to a second flow rate greater than the first flow rate to increase the pressure in the treating space to the treating pressure. The second flow rate is set to be higher than the first flow rate, and is set to a flow rate to increase the pressure in the treating space. A pressurization speed may be diversified in consideration of a phase behavior in the chamber to shorten a pressurization time.

According to an embodiment of the inventive concept, a predetermined treating fluid is continuously exhausted through the exhaust port 124. Thus, in order to increase the pressure of the inside of the treating space, the treating fluid should be supplied to the treating space at the second flow rate higher than the first flow rate.

According to one embodiment, the pressure increasing step I includes a first pressure increasing step I-A in which a first pressure increase is performed, a flow control step I-B, and a second pressure increasing step I-C in which a second pressure increase is performed.

Referring to FIG. 2 and FIG. 6, the first pressure increasing step I-A and the flow control step I-B are described. In the first pressure increasing step I-A, the treating fluid is supplied through the first supply port 122 at the first flow rate. The treating fluid may not reach a critical pressure thereof and thus create gas flow as one characteristic of the gas. When the treating fluid reaches a certain level of a pressure, the treating fluid is exhausted out of the treating space through the exhaust port 124 and the branch line L3 connected to the exhaust port 124, and then the flow control step I-B is performed. In the flow control step I-B, a laminar flow is created on the top face of the substrate W. Controlling the flow for a preset time duration allows the concentration of the chemical liquid to be lowered, and the concentration of the moisture remaining inside the chamber to be lowered. The flow control step I-B is performed at a pressure lower than the critical pressure Pcr of the treating fluid. In the flow control step I-B, the pressure in the treating space may be maintained at a constant pressure for a predefined time duration.

Referring to FIG. 3 and FIG. 6, the second pressure increasing step I-C is described. The flow control step I-B is carried out for a set time duration, such that the concentration of the chemical liquid is lowered, and the concentration of the moisture remaining in the chamber is lowered. Then, the supply flow rate of the treating fluid is increased to the second flow rate. The plurality of first adjustment valves 320a, 320b, and 320c are controlled to increase the supply flow rate of the treating fluid. As a result, when the treating fluid is supplied at the second flow rate as the increased flow rate, the second pressure increasing step I-C in which the second pressure increase is made is performed.

Referring to FIG. 4 and FIG. 6, a method for supplying the treating fluid when a current pressure of the treating fluid exceeds the critical pressure Pcr of the treating fluid in the second pressure increasing step I-C will be described. When current pressure of the treating fluid exceeds the critical pressure Pcr of the treating fluid, the treating fluid is supplied through the second supply port 112 in addition to supplying the treating fluid through the first supply port 122.

When the pressure in the inside of the treating space reaches the treating pressure, the replacement step II is performed. In the replacement step II, a flushing process in which a pressure decreasing process and a pressure increasing process in a range between the first pressure P1 and the second pressure P2 are alternately and repeated carried out may be performed. A process of supplying a predetermined amount of the treating fluid into the chamber through the second supply line L11 and the second supply port 112 and a process of exhausting the gas present in the treating space 102 in the above process through the exhaust port 124 may be alternately and repeatedly carried out.

With reference to FIG. 5 and FIG. 6, the exhausting step III of exhausting the inside of the treating space after the replacement step II is completed is described. When the treating is completed, the exhaust valve 410 is opened to exhaust and drain the treating fluid inside the treating space. In the exhausting step III, a exhausting speed of the treating fluid, that is, a pressure decreasing speed may be adjusted so that a temperature in the chamber is maintained at a higher level than the critical temperature of the treating fluid so that the treating fluid in the supercritical state is not brought into a liquid state. Thus, the process time may be reduced.

Figure 7:
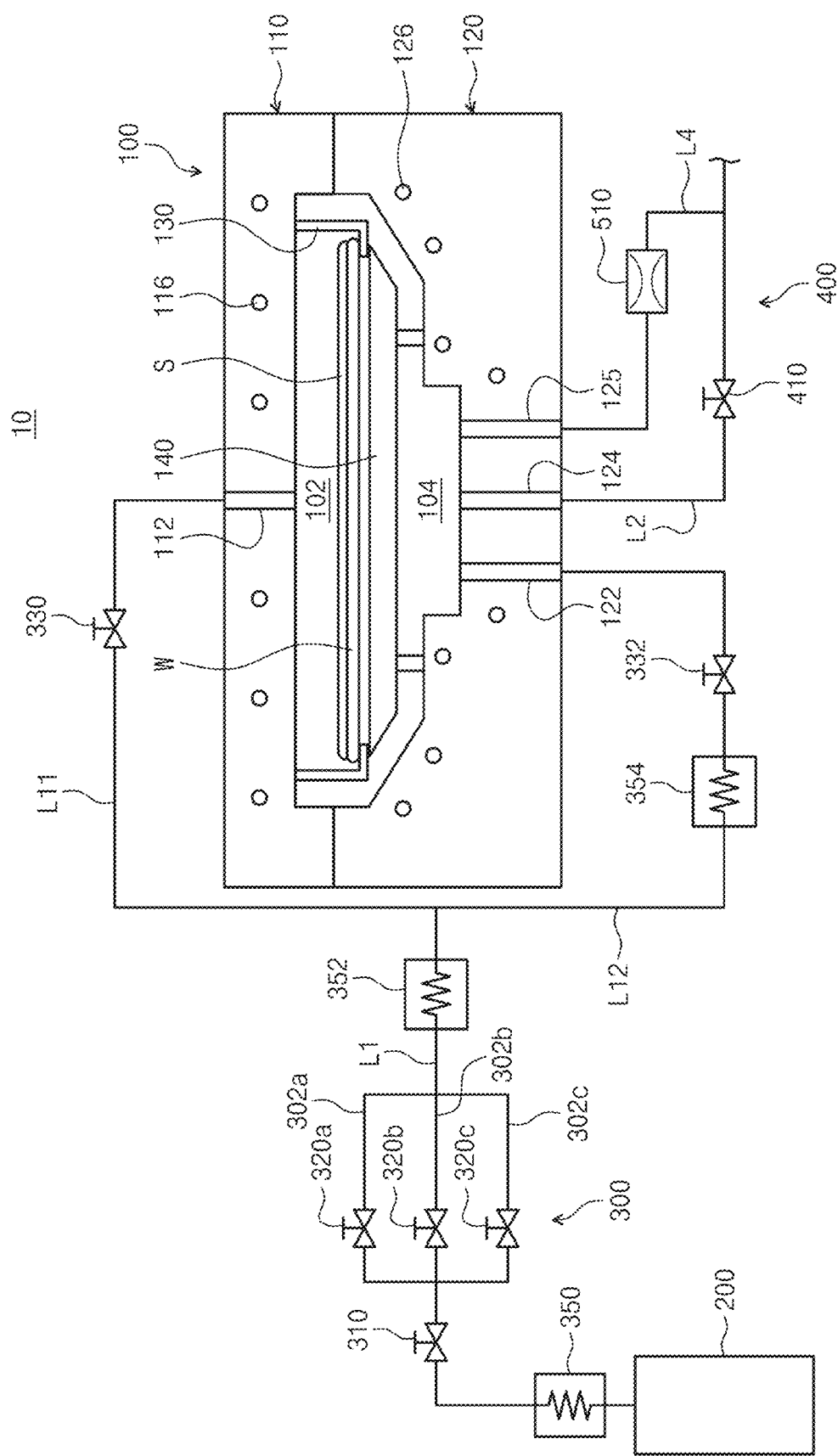
FIG. 7 is a diagram schematically showing a substrate treating apparatus according to another embodiment of the inventive concept.

FIG. 7 is a diagram schematically showing a substrate treating apparatus according to another embodiment of the inventive concept. Referring to FIG. 7, in another embodiment of the inventive concept, a second exhaust port 125 may be disposed at the lower chamber 120. The second exhaust port 125 is connected to a second exhaust line L4. The second exhaust port 125 and the second exhaust line L4 may correspond to the branch line L3 according to the embodiment of FIG. 1. The exhaust port 125 and the second exhaust line L4 are always open. The orifice 510 is installed at the second exhaust line L4 to set an exhaust flow rate.

According to the embodiment of FIG. 7, the first exhaust port 124 is disposed at a center of the lower wall of the lower chamber 120. The first supply port 122 is disposed at a position spaced in one direction from the first exhaust port 124. The second exhaust port 125 is disposed at a position spaced in the opposite direction from the first exhaust port 124 and is opposite to the first supply port 122 around the first exhaust port 124. According to the embodiment of FIG. 7, the first supply port 122 and the second exhaust port 125 are arranged to be symmetrical with each other around the first exhaust port 124, so that the fluid flow may be more smoothly controlled.

According to various embodiments of the inventive concept, the substrate treating apparatus may be capable of efficiently treating the substrate.

According to various embodiments of the inventive concept, the substrate treating apparatus may be capable of controlling flow of the treating fluid before the treating fluid is brought into a supercritical state.

According to various embodiments of the inventive concept, the substrate treating apparatus may be capable of controlling flow of the treating fluid before the treating fluid is brought into the supercritical state, thereby lowering an initial concentration of the chemical liquid, and lowering a concentration of the moisture remaining inside the chamber performing supercritical treating.

According to various embodiments of the inventive concept, the substrate treating apparatus may be capable of controlling a concentration of the chemical liquid and a concentration of residual moisture inside the chamber, thereby increasing a replacement force in a fine pattern and preventing drying failure.

Effects of the inventive concept are not limited to the above-mentioned effects, and other effects as not mentioned will be clearly understood by those skilled in the art from the above descriptions.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate using a treating fluid in a supercritical state, the apparatus comprising:
   a chamber configured to provide a treating space for treating the substrate;
   a substrate support within the chamber and configured to support the substrate when the substrate is loaded into the chamber;
   a first supply port in a lower wall of the chamber, wherein the first supply port is connected to a first supply line that is configured to supply the treating fluid to a portion of the treating space located below the substrate;
   an exhaust port in the lower wall of the chamber and spaced apart from the first supply port by a first spacing, wherein the exhaust port is connected to an exhaust line that is configured to exhaust the treating fluid from the chamber;
   a branch line branching from the exhaust line and at a position of the exhaust line upstream of an exhaust valve installed at the exhaust line, such that the branch line is a bypass line that bypasses the exhaust valve, wherein the branch line has an orifice, such that the branch line is always open, wherein both ends of the branch line are connected to the exhaust line; and
   a controller configured to control supply and exhaust of the treating fluid,
   wherein in a pressure increasing step of increasing a pressure in the treating space from a pressure lower than a critical pressure of the treating fluid to a treating pressure higher than the critical pressure, the controller is configured to control a supply amount of the treating fluid supplied from the first supply port so as to control flow of the treating fluid supplied from the first supply port and then exhausted through the exhaust port,
   wherein the branch line has no valve.

2. The apparatus of claim 1, wherein a diameter of the orifice is smaller than a diameter of the exhaust line.

3. The apparatus of claim 1, wherein the bypass line is installed in parallel to the exhaust valve.

4. The apparatus of claim 1, wherein the controller is configured to control the supply amount of the treating fluid so as to maintain the pressure in the treating space for a portion of an entire period of the pressure increasing step.

5. The apparatus of claim 1, wherein the controller is configured to:
   control a supply flow rate of the treating fluid to a first flow rate for a first portion of a period before the pressure in the treating space reaches the critical pressure of the treating fluid in the pressure increasing step, thereby controlling the flow of the treating fluid in the treating space; and
   control the supply flow rate of the treating fluid to a second flow rate greater than the first flow rate to increase the pressure in the treating space to the treating pressure.

6. The apparatus of claim 1, further comprising:
   a second supply port connected to a second supply line, the second supply line configured to supply the treating fluid to a portion of the treating space located above the substrate,
   wherein the controller is configured to:
   supply the treating fluid from the first supply port for a period before the pressure in the treating space reaches the critical pressure of the treating fluid in the pressure increasing step;
   supply the treating fluid in the supercritical state from the second supply port for a period after the pressure in the treating space has reached the critical pressure of the treating fluid; and
   after the treating of the substrate using the treating fluid in the supercritical state has been completed, open the exhaust valve to exhaust the treating fluid inside the treating space.

7. The apparatus of claim 1, further comprising:
   a blocking plate between the first supply port and the substrate support, the blocking plate configured to prevent the treating fluid from the first supply port from being sprayed directly onto the substrate,
   wherein a top face of the blocking plate is positioned adjacent to a bottom face of the substrate.

8. The apparatus of claim 1, wherein the controller is configured to control a supply flow rate of the treating fluid for a first period of the pressure increasing step and a supply flow rate of the treating fluid for a second period of the pressure increasing step subsequent to the first period to be different from each other.

9. The apparatus of claim 8, wherein the controller is configured to:
   control the supply flow rate of the treating fluid for the first period to a first flow rate; and
   control the supply flow rate of the treating fluid for the second period to a second flow rate greater than the first flow rate.

10. An apparatus for treating a substrate using a treating fluid in a supercritical state, the apparatus comprising:
    a chamber configured to provide a treating space for treating the substrate;
    a substrate support within the chamber and configured to support the substrate when the substrate is loaded into the chamber;
    a first supply port in a lower wall of the chamber, wherein the first supply port is connected to a first supply line that is configured to supply treating fluid to a portion of the treating space located below the substrate;
    a first exhaust port in the lower wall of the chamber and spaced apart from the first supply port by a first spacing, wherein the first exhaust port is connected to a first exhaust line, such that the first exhaust line is directly connected to the lower wall of the chamber through the first exhaust port, the first exhaust line having an exhaust valve and being configured to exhaust the treating fluid from the chamber;
    a second exhaust port in the lower wall of the chamber and spaced apart from the first supply port and the first exhaust port, the second exhaust port connected to a second exhaust line such that the second exhaust line is directly connected to the lower wall of the chamber through the second exhaust port, the second exhaust line being configured to bypass the first exhaust line and exhaust the treating fluid from the chamber, wherein the second exhaust port has an orifice, such that the second exhaust port is always open; and a controller configured to control supply and exhaust of the treating fluid, wherein in a pressure increasing step of increasing a pressure in the treating space from a pressure lower than a critical pressure of the treating fluid to a treating pressure higher than the critical pressure, the controller is configured to control a supply amount of the treating fluid supplied from the first supply port so as to control flow of the treating fluid supplied from the first supply port and then exhausted through the second exhaust port.

11. The apparatus of claim 10, wherein a diameter of the orifice is smaller than a diameter of the first exhaust line.

12. The apparatus of claim 10, wherein the controller is configured to control the supply amount of the treating fluid so as to maintain the pressure in the treating space for a portion of an entire period of the pressure increasing step.

13. The apparatus of claim 10, wherein the controller is configured to:

control a supply flow rate of the treating fluid to a first flow rate for a first portion of a period before the pressure in the treating space reaches the critical pressure of the treating fluid in the pressure increasing step, thereby controlling the flow of the treating fluid in the treating space; and control the supply flow rate of the treating fluid to a second flow rate greater than the first flow rate to increase the pressure in the treating space to the treating pressure.

14. The apparatus of claim 10, further comprising:

a second supply port connected to a second supply line that is configured to supply the treating fluid to a portion of the treating space located above the substrate, wherein the controller is configured to:

supply the treating fluid from the first supply port for a period before the pressure in the treating space reaches the critical pressure of the treating fluid in the pressure increasing step;

supply the treating fluid in the supercritical state from the second supply port for a period after the pressure in the treating space has reached the critical pressure of the treating fluid; and after the treating of the substrate using the treating fluid in the supercritical state has been completed, open a first exhaust valve in the first exhaust line to exhaust the treating fluid inside the treating space.

15. The apparatus of claim 10, wherein the first exhaust port is at a center of the lower wall of the chamber, the first supply port is at a position spaced, in one direction, from the first exhaust port, and the second exhaust port is at a position spaced, in an opposite direction to one direction, from the first exhaust port, and is opposite to the first supply port around the first exhaust port.

16. The apparatus of claim 10, wherein the controller is configured to control a supply flow rate of the treating fluid for a first period of the pressure increasing step and a supply flow rate of the treating fluid for a second period of the pressure increasing step subsequent to the first period to be different from each other.

17. The apparatus of claim 16, wherein the controller is configured to:

control the supply flow rate of the treating fluid for the first period to a first flow rate; and control the supply flow rate of the treating fluid for the second period to a second flow rate greater than the first flow rate.

18. The apparatus of claim 10, wherein the second exhaust line has no valve.

19. An apparatus for treating a substrate using a treating fluid in a supercritical state, the apparatus comprising:

a chamber configured to provide a treating space for treating the substrate;

a substrate support within the chamber and configured to support the substrate when the substrate is loaded into the chamber;

a first supply port connected to a first supply line and configured to supply treating fluid to a portion of the treating space located below the substrate;

a second supply port connected to a second supply line and configured to supply the treating fluid to a portion of the treating space located above the substrate;

a first exhaust port connected to a first exhaust line for exhausting the treating fluid from the chamber, the first exhaust line having an exhaust valve and the first exhaust line connected directly to the chamber through the first exhaust port;

a second exhaust port connected to a second exhaust line, such that the second exhaust line is connected directly to the chamber through the second exhaust port, the second exhaust line being configured to bypass the exhaust valve, wherein an orifice is installed in the second exhaust line, such that the second exhaust line is always open and a diameter of the orifice is smaller than a diameter of the second exhaust line;

a blocking plate between the first supply port and the substrate support and configured to prevent the treating fluid from the first supply port from being sprayed directly onto the substrate; and a controller configured to control supply and exhaust of the treating fluid, wherein in a pressure increasing step of increasing a pressure in the treating space from a pressure lower than a critical pressure of the treating fluid to a treating pressure higher than the critical pressure, the controller is configured to control a supply amount of the treating fluid supplied from the first supply port so as to control flow of the treating fluid supplied from the first supply port and then exhausted through at least one of the first exhaust port and the second exhaust port, wherein the controller is configured to control a supply flow rate of the treating fluid for a first period of the pressure increasing step and a supply flow rate of the treating fluid for a second period of the pressure increasing step subsequent to the first period to be different from each other, wherein the controller is further configured to:

control the supply flow rate of the treating fluid for the first period to a first flow rate; and control the supply flow rate of the treating fluid for the second period to a second flow rate greater than the first flow rate, wherein the first period is a period before the pressure inside of the treating space reaches the critical pressure of the treating fluid, supply the treating fluid from the first supply port for a period before the pressure in the treating space reaches the critical pressure of the treating fluid in the pressure increasing step;

supply the treating fluid in the supercritical state from the second supply port for a period after the pressure in the treating space has reached the critical pressure of the treating fluid; and after the treating of the substrate using the treating fluid in the supercritical state has been completed, open the exhaust valve to exhaust the treating fluid inside the treating space.

\* \* \* \* \*